United States Patent [19]
Lo et al.

[11] Patent Number: 5,966,626
[45] Date of Patent: Oct. 12, 1999

[54] METHOD FOR STABILIZING A SILICON STRUCTURE AFTER ION IMPLANTATION

[75] Inventors: Yung-Tsun Lo; Cheng-Hsun Tsai; Wen-Yu Ho, all of Hsinchu; Jung-Chun Hsieh, Hsin-Chu, all of Taiwan

[73] Assignee: Mosel Vitelic, Inc., Hsinchu, Taiwan

[21] Appl. No.: 08/743,744

[22] Filed: Nov. 7, 1996

[51] Int. Cl.[6] .......................... H01L 21/425; H01L 21/66
[52] U.S. Cl. .............................. 438/530; 438/14
[58] Field of Search .................. 438/530, 14, 16, 438/17, 18, 527, 528, 529, 535, 514, FOR 142, FOR 101; 156/626.1

[56] References Cited

U.S. PATENT DOCUMENTS

| | | | |
|---|---|---|---|
| 4,151,008 | 4/1979 | Kirkpatrick | 438/522 |
| 4,682,407 | 7/1987 | Wilson | 438/517 |
| 4,701,422 | 10/1987 | Elliott | 438/14 |
| 5,185,273 | 2/1993 | Jasper | 438/14 |
| 5,361,015 | 11/1994 | Okumuki et al. | 438/20 |
| 5,550,082 | 8/1996 | Wolfe et al. | 438/567 |
| 5,643,404 | 7/1997 | Muraoka et al. | 438/16 |

*Primary Examiner*—Michael Trinh
*Attorney, Agent, or Firm*—Tung & Associates

[57] ABSTRACT

The present invention provides a method for stabilizing the crystal structure of a silicon substrate after an ion implantation process including the step of exposing the substrate to a temperature not higher than 200° C. for a time period of not less than 10 seconds, and preferably to a temperature between about 100° C. and about 200° C. for a time period of between about 10 seconds and about 10,000 seconds.

8 Claims, 1 Drawing Sheet

METHOD FOR STABILIZING A SILICON STRUCTURE AFTER ION IMPLANTATION

FIELD OF THE INVENTION

The present invention generally relates to a method for stabilizing the crystal structure of a silicon substrate after an ion implantation process and more particularly, relates to a method for stabilizing the crystal structure of a silicon substrate after an ion implantation process by exposing the substrate to a temperature not higher than 200° C. for a suitable period of time.

BACKGROUND OF THE INVENTION

Ion implantation method has been used for placing impurity, or doping, ions in a semiconductor material such as in a silicon substrate at precisely controlled depths and with accurate control of dopant ion concentration. One of the major benefits of the method is its capability to precisely place ions at preselected locations and at predetermined dosage. It is a very reproducible process that enables a high level of dopant uniformity. For instance, a typical variation of less than 1% can be obtained across a wafer.

An ion implanter operates by providing an ion source wherein collisions of electrons and neutral atoms result in a large number of various ions being produced. The ions required for doping are then selected out by an analyzing magnet and sent through an acceleration tube. The accelerated ions are then bombarded directly onto the portion of a silicon wafer where doping is required. The bombardment of the ion beam is usually conducted by scanning the beam or by rotating the wafer in order to achieve uniformity. A heavy layer of silicon dioxide or a heavy coating of a positive photoresist image is used as the implantation mask. The depth of the dopant ions implanted can be determined by the energy possessed by the dopant ions, which is normally adjustable by changing the acceleration chamber voltage. The dosage level of the implantation, i.e., the number of dopant ions that enters into the wafer, is determined by monitoring the number of ions passing through a detector. As a result, a precise control of the junction depth planted in a silicon substrate can be achieved by adjusting the implantation energy, while a precise control of the dopant concentration can be achieved by adjusting the dosage level.

When a silicon substrate is implanted, a high energy ion beam enters a perfect crystal structure below the wafer surface to knock atoms out of the crystal lattice and changes the top layer of a few thousand angstroms thickness to an amorphous structure. The physical change from a crystalline structure to an amorphous structure radically changes the electrical properties of the silicon material and causing damages to an otherwise perfect crystal structure. Generally, the higher the implantation dosage used, the higher the degree of damage is made to the crystal lattice of the silicon material. While the surface layer of the crystal lattice in the silicon is temporarily damaged by the implanted ions, the silicon atoms in the lattice including those which are knocked out of the lattice sites have certain degree of self-repairing capability. This self-repairing capability is normally triggered by thermal energy and the tendency that a crystal structure normally resumes its original condition after a disturbance in its structure has occurred.

An important aspect in the application of the ion implantation technology is the capability of measuring the degree of implantation in the silicon material. In other words, the capability of measuring the disturbance or damage made by the impurity or dopant ions to the perfect crystal structure of silicon. One of the methods capable of measuring the degree of implantation is a TP-400 XP system made by the Therma-Wave Company. The system is utilized for determining the degree of damage in the crystal lattice of a silicon wafer after an ion implantation process. The system is used in semiconductor fabrication processes to first determine the degree of damage in a crystal structure, and then using such data to determine the various implantation parameters such as the implantation energy, the type of impurity ions to be implanted, and the dosage of the ions implanted. An optimal implantation process can then be carried out by using these selected processing parameters based on the test result obtained from a TP-400 XP system. After such an optimum implantation process is determined, the processing parameters can be used for volume. production of a semiconductor device from silicon wafers.

A schematic diagram of the TP-400 XP system 10 is shown in FIG. 1. An argon ion pump laser 12 having an intensity modulation of 1 MHz emits a laser beam 14 through a beam splitter 16 and a condenser lens 18 to irradiate on a silicon wafer 22. The laser beam 14 is condensed into a focused beam 26 having a width of approximately 1 micron at the point in contact with the top surface 24 of the silicon wafer 22. The plasma generated by the argon ion pump laser reacts with the silicon crystal structure damaged by the ion implantation process in the surface layer of the wafer and then reflects from the surface 24. The reflected wave 32 is detected by another helium neon probe laser 28. Assuming the intensity of the incident wave 14 is R and the intensity change in the reflected wave 32 is $\Delta R$, then detector 34 detects a thermal wave (TW) signal which represents $\Delta R/R$. A second beam splitter is used in the path of the detector 34.

FIG. 2 shows a graph illustrating the dependency of the thermal wave signal on the implantation dosage for an ion implantation process utilizing boron as the dopant. Data was obtained by a TP-400 XP system after an ion implantation process was conducted on a silicon wafer by using boron as dopant at an implantation energy of 100 KeV. As shown in FIG. 2, the higher the implantation dosage used, the larger the damage made to the silicon crystal. This is indicated by the increased thermal wave signal. The thermal wave measurement conducted on an implanted silicon wafer surface therefore provides a convenient method for indicating the damage inflicted in a crystal structure after an ion implantation process is conducted on the silicon wafer.

A problem incurred in making thermal wave measurements on an implanted silicon surface is the instability of the data obtained immediately after the wafer is implanted. The phenomenon is attributed to the fact that after ions are implanted into a silicon substrate, even though the crystal lattice in the surface layer is damaged by the implanted ions, the displaced atoms in the crystal lattice have the tendency and capability of self-repairing and thus attempt to repair the damaged structure and to return to its original undamaged state. The self-repairing process is reflected in thermal wave measurements made by the TP-400 XP system by the ever-changing thermal wave. As a result, the degree of damage to the crystal lattice cannot be determined reliably by the thermal wave data. Consequently, the processing parameters for the implantation process cannot be reliably determined and that a fabrication process for volume production of the semiconductor device from a silicon wafer can not be carried out.

It is therefore an object of the present invention to provide a method for stabilizing the crystal structure in a silicon substrate after an ion implantation process that does not have the drawbacks or shortcomings of conventional methods.

It is another object of the present invention to provide a method for stabilizing the crystal structure of a silicon substrate after an ion implantation process by exposing the substrate to a heat treatment temperature that is sufficiently low such that a complete recovery of the crystal structure can not take place.

It is a further object of the present invention to provide a method for stabilizing the crystal structure of a silicon substrate after an ion implantation process by exposing the substrate to a heat treatment temperature not higher than 200° C. such that the damaged crystal structure does not completely recover.

It is still another object of the present invention to provide a method for stabilizing the crystal structure of a silicon substrate after an ion implantation process by exposing the substrate to a heat treatment temperature that is sufficiently low such that only a self-repairing process of the damaged crystal lattice can take place to stabilize the structure.

It is yet another object of the present invention to provide a method for stabilizing the crystal structure of a silicon substrate after an ion implantation process wherein the substrate is exposed to a heat treatment temperature not higher than 200° C. for a time period not less than 10 seconds.

It is another further object of the present invention to provide a method for stabilizing the crystal structure of a silicon substrate after an ion implantation process wherein the substrate is exposed to a temperature that is sufficiently low such that the self-repairing process of the crystal lattice can be saturated while the lattice remains in an implanted state.

SUMMARY OF THE INVENTION

The present invention provides a method for stabilizing a crystal structure of a silicon substrate after an ion implantation process in which the surface layer of the crystal structure of the silicon is damaged by subjecting the substrate to a sufficiently low temperature such that only a self-repairing process of the crystal lattice can be completed and a stabilized implanted crystal structure can be obtained.

In a preferred embodiment, the silicon substrate is exposed to a heat treatment temperature not higher than 200° C. for a time period not less than 10 seconds, and preferably to a temperature between about 100° C. and about 200° C. for a time period of between about 10 seconds and about 10,000 seconds. The low temperature annealing process enables the damaged crystal lattice to complete its self-repairing process while maintaining the crystal lattice in an implanted state and thus not allowing the structure to recover to a state prior to the ion implantation process. The ion implantation process utilizing at least one ion implanted into the crystal structure wherein the ion can be selected from a group consisting of antimony, arsenic, beryllium, boron, gallium, germanium, phosphorous and silicon.

The present invention is further directed to a semiconductor structure built on a silicon substrate that has impurity ions implanted therein which includes a silicon crystal structure, and at least one impurity ion implanted in the structure wherein the ion is selected from the group consisting of antimony, arsenic, beryllium, boron, gallium, germanium, phosphorous and silicon. The ion implanted structure is stabilized by exposing the structure to a heat treatment temperature between about 100° C. and about 200° C. for a time period of not less than 10 seconds.

BRIEF DESCRIPTION OF THE DRAWINGS

Other objects, features, and advantages of the present invention will become apparent upon consideration of the specification and the appended drawings, in which.

DETAILED DESCRIPTION OF THE PREFERRED EMBODIMENT

Figure 1:
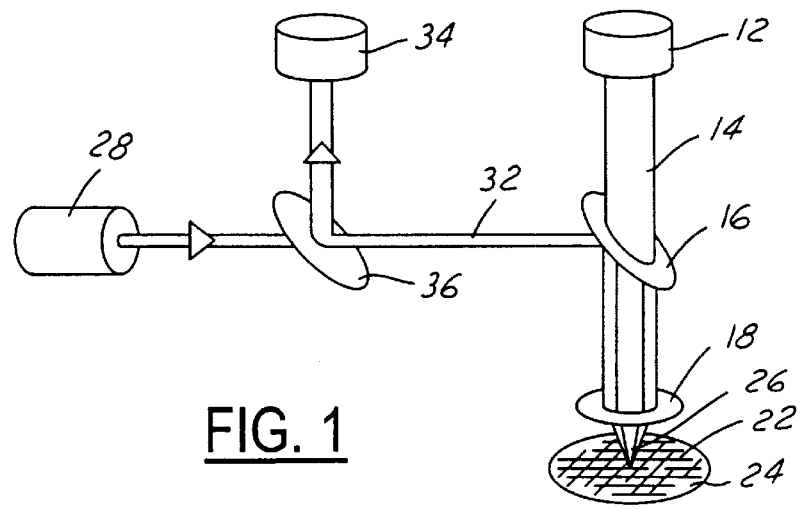
FIG. 1 is a schematic illustrating a thermal wave detection system utilized in the present invention method for determining the stability of an implanted crystal structure.
Figure 2:
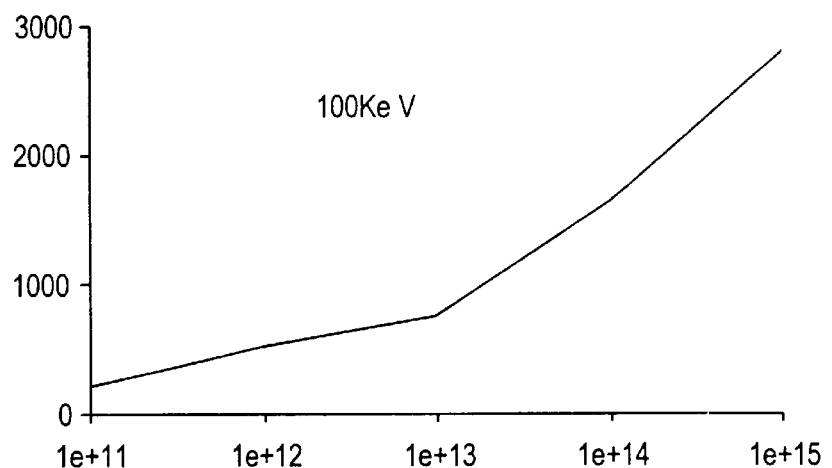
FIG. 2 is a graph illustrating the dependency of thermal wave signals on the implantation dosage for boron dopant.
Figure 3:
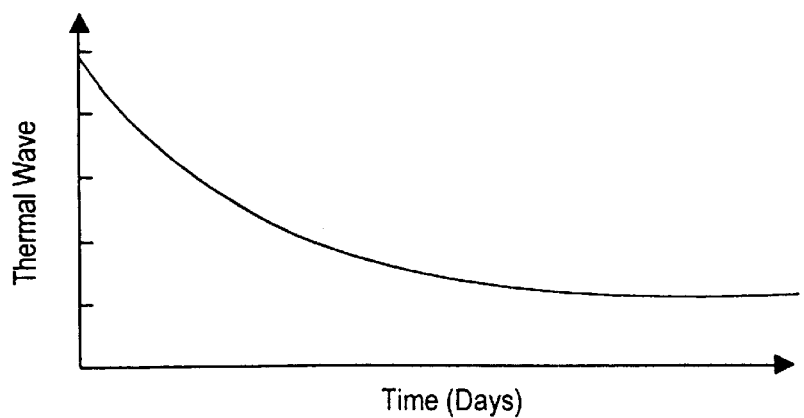
FIG. 3 is a graph illustrating the dependency of thermal wave signals on the time period after the ion implantation process.

The present invention provides a novel method for stabilizing a crystal structure on a silicon substrate after an ion implantation process including the step of exposing the substrate to a heat treatment temperature not higher than 200° C. for a suitable period of time such that the self-repairing process by the crystal lattice itself can be completed (or saturated) and consequently a stable thermal wave measurement can be obtained.

In the preferred embodiment, a silicon wafer after it has been ion implanted is heat treated at a temperature in the range of between about 100° C. and about 200° C. for a time period between about 10 seconds and about 10,000 seconds. The heat treatment accelerates the self-repairing process of the crystal lattice in the ion implanted silicon substrate such that the self-repairing action by the damaged crystal structure can be saturated (or completed) and that the self-repairing action is subsequently stopped to provide a stabilized ion-implanted crystal structure. The method enables a stabilized crystal structure to be measured by a thermal wave measurement system such that the state of the ion implanted crystal lattice can be accurately determined. As a consequence, the processing parameters used in the ion implantation process can be adjusted accordingly to produce the desirable implanted state after an implantation process.

The advantages of the present invention method are made possible by the low temperature used in the heat treatment, i.e., below a maximum of 200° C. It was discovered that when a high temperature annealing process is conducted, i.e., at an annealing temperature higher than 200° C., the damaged crystal lattice in the implanted state can recover completely such that the effect of the ion implantation is erased.

The present invention novel method can be conducted in a temperature range between about 100° C. and about 200° C., and preferably between about 150° C. and about 200° C. The annealing time required is between about 10 seconds and about 10,000 seconds, and preferably between about 1,000 seconds and about 3,000 seconds. The heat treatment process should be conducted in an inert gas atmosphere such that no other undesirable reaction can occur.

To illustrate the present invention method, a P+ type silicon substrate is first provided, a field oxide layer is then formed on top of the silicon substrate. A gate oxide layer is subsequently formed on top of the field oxide layer and then by utilizing a low pressure chemical vapor deposition technique, a first layer of polysilicon having a thickness of between about 1500 Å and about 4000 Å is deposited. After a layer of silicon dioxide is formed and a gate region is defined by a photomasking technique, phosphorous or arsenic type ions are implanted into the first polysilicon layer.

After the ion implantation process, the silicon wafer is heat treated at a temperature between about 120° C. and about 200° C. for a time period between about 1200 seconds and about 2400 seconds. An inert gas of nitrogen is used in the heat treatment chamber during the process. A more preferred heat treatment temperature is between about 150° C. and about 180° C. for a time period of about 1800 seconds.

EXAMPLE 1

In this example, a silicon wafer having a layer of 200 Å thickness oxide deposited on top is used. The ion implantation dosage used is 1E13 of phosphorous P+31 ions implanted at an implantation energy of 100 KeV. The crystal structure of the silicon wafer is then monitored by a thermal wave measurement technique by using a TP-400 XP system for a time period of approximately 45 days. No post-implantation annealing process was carried out on the wafers. Table 1 shows the thermal wave data obtained on the surface of the silicon wafer during the 45 days. It is seen that the thermal wave data varies significantly between a minimum measurement of 895.4 and a maximum measurement of 915.3. The changing structure of the silicon wafer exemplifies the self-repairing process occurred in the damaged crystal lattice of the silicon material wherein displaced silicon atoms attempted to repair itself by resuming to its originally undamaged state. The data measured on the wafer illustrates the problem previously described of not being able to determine a stabilized implanted state of the silicon crystal such that ideal implantation parameters can be reliably determined for a fabrication process.

TABLE 1

| DATE | TW |
|---|---|
| 10/03 | 901 |
| 10/06 | 906.2 |
| 10/07 | 902 |
| 10/12 | 905.3 |
| 10/13 | 910.2 |
| 10/14 | 909.1 |
| 10/15 | 904.2 |
| 10/16 | 908.7 |
| 10/17 | 905.8 |
| 10/22 | 906.7 |
| 10/23 | 907.6 |
| 10/24 | 904.4 |
| 10/25 | 915.3 |
| 10/26 | 909.8 |
| 11/04 | 909.8 |
| 11/07 | 902.7 |
| 11/11 | 895.4 |
| Mean | 906.1 |

EXAMPLE 2

In this example, silicon wafers having 200 Å thickness of oxide layer coated on top are used. The wafers were first implanted at a dosage level of 1.2 E 12 with phosphorous ions of P+31 at an implantation energy of 40 KeV. The wafers, after an implantation process is completed thereon, are heat treated at 150° C. for 900 seconds. Table 2 illustrates the TW (or the ΔR/R) values obtained during a time period of approximately 45 days. It is seen that a substantially stabilized crystal structure is obtained after the heat treatment process. The maximum value obtained was 501.9 while the minimum value obtained was 498.9. The maximum variation is less than one sixth of that shown in Example 1 which was not heat treated. The implanted silicon crystal structure is therefore stabilized indicating that the self-repairing actions by the silicon atoms are completed.

TABLE 2

| DATE | TW |
|---|---|
| 30-SEPT. | 501.3 |
| 01-OCT. | 501.9 |
| 02-OCT. | 501.9 |
| 03-OCT. | 502.1 |
| 04-OCT. | 501.5 |
| 04-OCT. | 499.7 |
| 05-OCT. | 499.8 |
| 06-OCT. | 499.5 |
| 07-OCT. | 498.5 |
| 08-OCT. | 498.3 |
| 09-OCT. | 500 |
| 10-OCT. | 499.7 |
| 11-OCT. | 498.9 |
| 12-OCT. | 499.6 |
| 13-OCT. | 498.3 |
| 15-OCT. | 501.5 |
| 16-OCT. | 500.6 |
| 17-OCT. | 501.1 |
| 18-OCT. | 500 |
| 19-OCT. | 500.9 |
| 20-OCT. | 501 |
| 21-OCT. | 500.9 |
| 22-OCT. | 501.3 |
| 24-OCT. | 501.3 |
| 25-OCT. | 502 |
| 26-OCT. | 501.2 |
| 27-OCT. | 501.2 |
| 28-OCT. | 503.5 |
| 29-OCT. | 503.7 |
| 01-NOV. | 502.9 |
| 02-NOV. | 502.2 |
| 04-NOV. | 502.7 |
| 05-NOV. | 502.3 |
| 07-NOV. | 502.7 |
| 08-NOV. | 502.8 |
| 09-NOV. | 503.6 |
| 10-NOV. | 503 |
| 11-NOV. | 503.1 |
| 13-NOV. | 501.4 |
| 14-NOV. | 501.4 |
| MEAN | 501.52 |
| STD | 1.76 |
| STD % | 0.35% |

EXAMPLE 3

In this example, silicon wafers having 200 Å thickness of oxide coated on top are used. The silicon wafers are first implanted at a dosage of 1.2 E 13 with phosphorous ions P+31 at an implantation energy of 100 KeV. The wafers, after the implantation process, are then heat treated at 150° C. for 900 seconds. The thermal wave data TW obtained are shown in Table 3 during a time period of approximately 45 days. It again shows that a greatly stabilized silicon structure is obtained as indicated by a maximum TW value of 910.5 and a minimum TW value of 904.4. The variation in data is only about one third of that shown in Example 1 which was not heat treated. The larger variation in data observed in this example when compared to data of Example 2 (shown in Table 2) clearly demonstrates that at an implantation energy of 100 KeV (Example 3), an implanted silicon crystal structure has incurred more crystal structure damage which leads to a larger deviation in the thermal wave data.

TABLE 3

| DATE | TW |
|---|---|
| 30-SEPT. | 906.6 |
| 01-OCT. | 907.7 |

TABLE 3-continued

| DATE | TW |
|---|---|
| 02-OCT. | 907 |
| 03-OCT. | 907.5 |
| 04-OCT. | 907.3 |
| 05-OCT. | 908.7 |
| 06-OCT. | 907.4 |
| 08-OCT. | 907.4 |
| 09-OCT. | 907.1 |
| 10-OCT. | 904.8 |
| 11-OCT. | 906.2 |
| 12-OCT. | 907.1 |
| 13-OCT. | 907.7 |
| 15-OCT. | 907.7 |
| 16-OCT. | 907.5 |
| 17-OCT. | 908.8 |
| 18-OCT. | 907.3 |
| 19-OCT. | 907.3 |
| 20-OCT. | 907.4 |
| 21-OCT. | 908.1 |
| 22-OCT. | 905.1 |
| 24-OCT. | 904.4 |
| 25-OCT. | 904 |
| 26-OCT. | 904.2 |
| 27-OCT. | 907.6 |
| 28-OCT. | 906.2 |
| 29-OCT. | 909.9 |
| 01-NOV. | 910.5 |
| 02-NOV. | 910.4 |
| 04-NOV. | 909.2 |
| 05-NOV. | 909.1 |
| 06-NOV. | 908.8 |
| 07-NOV. | 909.2 |
| 08-NOV. | 909.5 |
| 09-NOV. | 908.7 |
| 10-NOV. | 908.9 |
| 11-NOV. | 909.2 |
| 13-NOV. | 907.4 |
| 14-NOV. | 906.9 |
| MEAN | 907.41 |
| STD | 2.2432 |
| STD % | 0.25% |

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method of implanting at least one impurity ion into a silicon structure comprising the steps of:
   providing a silicon substrate,
   implanting said substrate with at least one ion selected from the group consisting of antimony, arsenic, beryllium, boron, gallium, germanium, phosphorus and silicon, and
   exposing said implanted substrate to a temperature of between about 150° C. and about 200° C. for a time period of not less than 10 seconds so as to stabalize the crystal structure of the silicon substrate after implantation.

2. A method according to claim 1, wherein said implanted substrate comprising said at least one ion at a concentration between about $10^{13}/cm^3$ and about $10^{16}/cm^3$.

3. A method according to claim 1, wherein said exposing step for annealing is conducted between two hot plates.

4. A method of implanting at least one impurity ion into a silicon structure comprising the steps of:
   providing a silicon substrate,
   implanting said substrate with at least one ion selected from the group consisting of antimony, arsenic, beryllium, boron, gallium, germanium, phosphorus and silicon, at a dosage between about $1E10/cm^2$, and about $1E14/cm^2$, and
   exposing said implanted substrate to a temperature of between about 150° C. and about 200° C. for a time period of not less than 10 seconds so as to stabalize the crystal structure of the silicon substrate after implantation.

5. A method according to claim 4, wherein said implanted substrate comprising said at least one ion at a concentration between about $10^{13}/cm^3$ and about $10^{16}/cm^3$.

6. A method according to claim 4, wherein said exposing step for annealing is conducted between two hot plates.

7. A method according to claim 4, wherein said exposing step for annealing is conducted for a time period between about 10 seconds and about 10,000 seconds.

8. A method according to claim 4, wherein said exposing step for annealing is conducted for a time period preferably between about 1,000 seconds and about 3,000 seconds.

* * * * *